(12) United States Patent
Joo et al.

(10) Patent No.: US 7,672,183 B2
(45) Date of Patent: Mar. 2, 2010

(54) SEMICONDUCTOR MEMORY DEVICE WITH TWO-STAGE INPUT BUFFER

(75) Inventors: Yong-Suk Joo, Kyoungki-do (KR); Byoung-Jin Choi, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 252 days.

(21) Appl. No.: 12/000,230

(22) Filed: Dec. 11, 2007

(65) Prior Publication Data
US 2008/0247250 A1    Oct. 9, 2008

(30) Foreign Application Priority Data
Apr. 5, 2007   (KR) .................... 10-2007-0033547

(51) Int. Cl.
*G11C 7/02*   (2006.01)
(52) U.S. Cl. .................. 365/207; 365/205; 365/194; 365/210.1
(58) Field of Classification Search .......... 365/207, 365/205, 210.1, 194
See application file for complete search history.

(56) References Cited

U.S. PATENT DOCUMENTS
7,379,355 B2 *   5/2008   Kim et al. ............ 365/194

FOREIGN PATENT DOCUMENTS
| KR | 10-2001-0068246 A | 7/2001 |
| KR | 10-2003-0056402 A | 7/2003 |
| KR | 10-2003-0078334 A | 10/2003 |
| KR | 10-2006-0026509 A | 3/2006 |

OTHER PUBLICATIONS

Korean Notice of Allowance issued in Korean Patent Application No. KR 10-2007-0033547, dated Apr. 28, 2008.

* cited by examiner

*Primary Examiner*—David Lam
(74) *Attorney, Agent, or Firm*—IP & T Law Firm PLC

(57) ABSTRACT

A semiconductor memory device includes: a pre-amplifying unit configured to amplify a difference between an input signal and a reference signal to output a pre-output signal; a delaying unit configured to delay the input signal to output a delayed input signal; and a main amplifying unit configured to receive the pre-output signal and the delayed input signal as differential inputs to output an output signal.

10 Claims, 5 Drawing Sheets

SEMICONDUCTOR MEMORY DEVICE WITH TWO-STAGE INPUT BUFFER

CROSS-REFERENCE TO RELATED APPLICATIONS

The present invention claims priority of Korean patent application number 10-2007-0033547, filed on Apr. 5, 2007, which is incorporated by reference in its entirety.

BACKGROUND OF THE INVENTION

The present invention relates to a semiconductor device, and more particularly, to a semiconductor memory device including a two-stage input buffer for stably ensuring a setup time margin and a hold time margin under pressure, voltage and temperature (PVT) variation.

A semiconductor device is fabricated using a variety of semiconductor technology including a silicon wafer processing technology and a logic design technology. In the semiconductor fabricating process, a final product is a plastic package type chip. The plastic package type chip has different logics and functions according to its use. Most of the semiconductor chips are mounted on a printed circuit board (PCB) that is an important component in a system configuration. Appropriate driving voltages are applied to the chips. Semiconductor devices including a semiconductor memory device operate according to the input/output of particular signals. That is, an operation and an operation method of the semiconductor device are determined by combination of input signals, and the semiconductor device outputs different signals according to the combination of the input signals. Further, an output signal of the semiconductor device can be used as an input signal of another semiconductor device within the same system.

An input buffer buffers an external signal and inputs the buffered signal to an internal circuit of the semiconductor device. A simple input buffer is a static input buffer. The static input buffer is an inverter configured with a PMOS transistor and an NMOS transistor serially connected between a power supply terminal and a ground terminal. The static input buffer has a simple structure but is weak against noise. Therefore, a swing width between a logic high level and a logic low level must be large. Consequently, the static input buffer is inappropriate to devices in which an input signal has a large swing width or which requires a high operating frequency.

In order to meet such a demand, a differential amplifier type input buffer has been proposed. The differential amplifier type input buffer is also called a dynamic input buffer.

FIG. 1 is a block diagram of a conventional semiconductor memory device including a two-stage input buffer.

Referring to FIG. 1, the conventional semiconductor memory device includes a pre-amplifying unit 10 and a main amplifying unit 20. The pre-amplifying unit 10 detects a voltage difference between an input signal IN and a reference voltage VREF to output positive and negative pre-output signals OUT_PRE and OUT_PREB. The main amplifying unit 20 receives the positive and negative pre-output signals OUT_PRE and OUT_PREB as differential inputs to output an output signal OUT. The positive and negative pre-output signals OUT_PRE and OUT_PREB have opposite phases to each other.

FIG. 2 is a waveform diagram of the signals in the semiconductor memory device illustrated in FIG. 1.

Referring to FIG. 2, when the input signal IN has a voltage level higher than that of the reference voltage VREF, the pre-amplifying unit 10 outputs the positive pre-output signal OUT_PRE of a logic high level and the negative pre-output signal OUT_PREB of a logic low level. The main amplifying unit 20 outputs the output signal OUT of a logic low level in response to the positive and negative pre-output signals OUT_PRE and OUT_PREB.

If a pulse signal of a logic low level is applied as the input signal IN, the input signal IN has a voltage level lower than that of the reference voltage VREF. At this time, the pre-amplifying unit 10 outputs the positive pre-output signal OUT_PRE of a logic low level and the negative pre-output signal OUT_PREB of a logic high level. The main amplifying unit 20 outputs a pulse signal of a logic high level as the output signal OUT.

As described above, the conventional semiconductor memory device allows the output signal OUT to swing fully between 0 V and a power supply voltage VDD by performing two-stage amplification process through the pre-amplifying unit 10 and the main amplifying unit 20.

In the conventional semiconductor memory device, when the reference voltage VREF varies with external environments, activation timing and activation duration of the output signal OUT are influenced.

FIG. 3 is a waveform diagram of the signals in the semiconductor memory device illustrated in FIG. 1 when a voltage level of the reference voltage VREF decreases.

As shown, when a voltage level of the reference voltage VREF decreases, the pre-amplifying unit 10 cannot detect, in time, a pulse signal of a logic low level being applied as the input signal IN. Thus, the activation timings of the positive and negative pre-output signals OUT_PRE and OUT_PREB are delayed and their activation durations are shortened. Consequently, the activation timing of the output signal OUT from the main amplifying unit 20 is delayed and its activation duration is shortened.

In this case, setup/hold time requirements are not met in a block (not shown) receiving the delayed output signal. Hence, the signals are not correctly recognized.

Although not illustrated, when a voltage level of the reference voltage VREF increases, the output signal OUT is activated earlier and its activation duration is lengthened. In this case, a block receiving the output signal may not recognize the signals due to the reduction of the setup time margin.

Moreover, since the positive and negative pre-output signals OUT_PRE and OUT_PREB have opposite phases to each other and are influenced by variation of the reference voltage VREF, the main amplifying unit 20 receiving the positive and negative pre-output signals OUT_PRE and OUT_PREB is further influenced by the variation of the reference voltage VREF.

Therefore, the conventional semiconductor memory device generates signals that do not meet the setup/hold time requirements when the voltage level of the reference voltage VREF varies with PVT variation, thus causing malfunction of the semiconductor memory device.

SUMMARY OF THE INVENTION

Embodiments of the present invention are directed to providing a semiconductor memory device including a two-stage input buffer that stably ensures a setup time margin and a hold time margin under PVT variation.

In accordance with an aspect of the present invention, there is provided a semiconductor memory device, including: a pre-amplifying unit configured to amplify a difference between an input signal and a reference signal to output a pre-output signal; a delaying unit configured to delay the input signal to output a delayed input signal; and a main amplifying unit configured to receive the pre-output signal and the delayed input signal as differential inputs to output an output signal.

In accordance with an aspect of the present invention, there is provided a method for driving a semiconductor memory device, including: a pre-amplifying unit configured to amplify a difference between an input signal and a reference signal to output a pre-output signal; a delaying unit configured to delay the input signal to output a delayed input signal; and a main amplifying unit configured to receive the pre-output signal and the delayed input signal as differential inputs to output an output signal.

DESCRIPTION OF SPECIFIC EMBODIMENTS

Hereinafter, a semiconductor memory device including a two-stage input buffer in accordance with the present invention will be described in detail with reference to the accompanying drawings.

Figure 1:
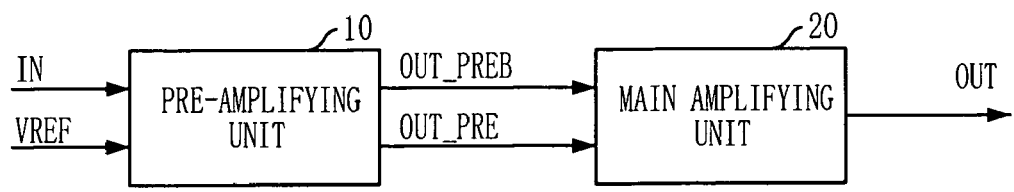
FIG. 1 is a block diagram of a conventional semiconductor memory device including a two-stage input buffer.
Figure 2:
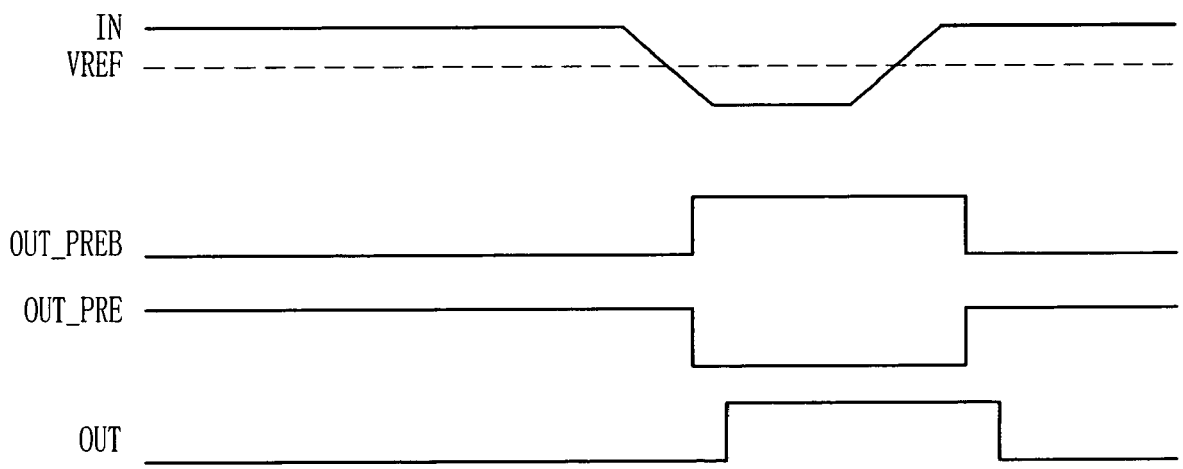
FIG. 2 is a waveform diagram of the signals in the semiconductor memory device illustrated in FIG. 1.
Figure 3:
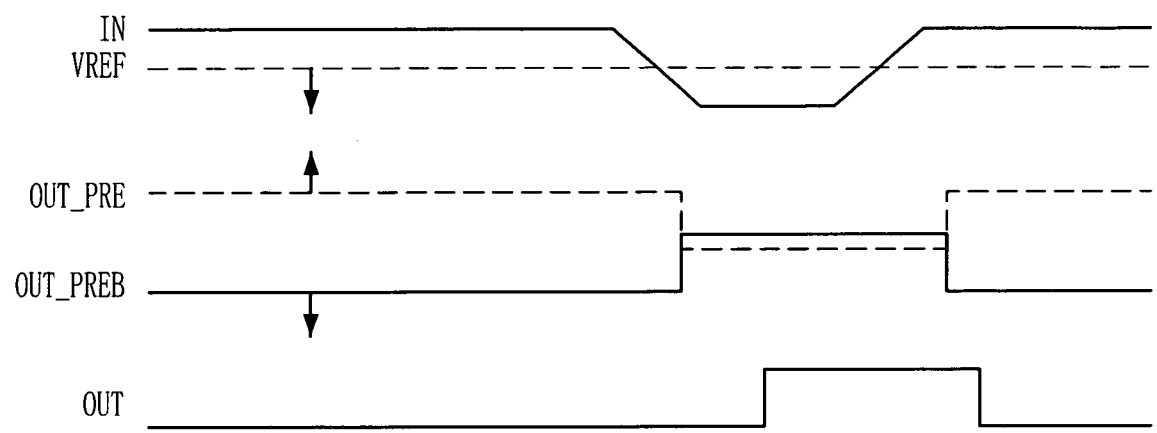
FIG. 3 is a waveform diagram of the signals in the semiconductor memory device illustrated in FIG. 1 when a voltage level of the reference voltage VREF decreases.
Figure 4:
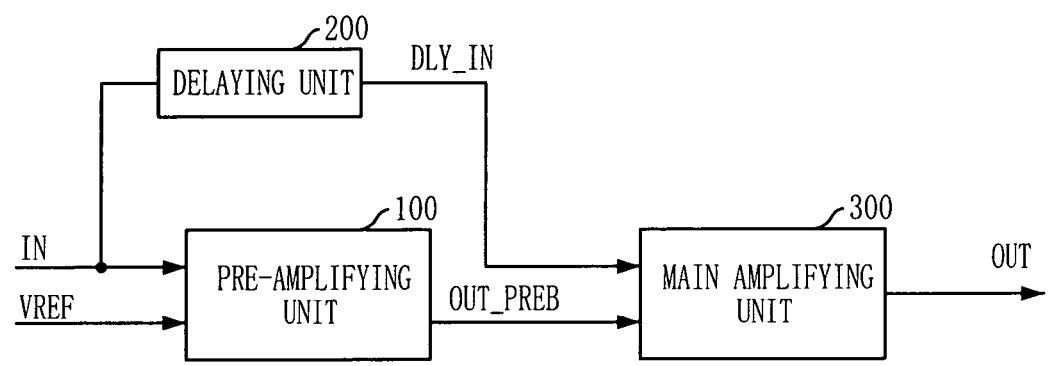
FIG. 4 is a block diagram of a semiconductor memory device including a two-stage input buffer in accordance with an embodiment of the present invention.

FIG. 4 is a block diagram of a semiconductor memory device including a two-stage input buffer in accordance with an embodiment of the present invention.

As shown, the semiconductor memory device includes a pre-amplifying unit 100, a delaying unit 200, and a main amplifying unit 300. The pre-amplifying unit 100 detects a voltage difference between an input signal IN and a reference voltage VREF to output a pre-output signal OUT_PREB. The delaying unit 200 delays the input signal IN to output a delayed input signal DLY_IN. The main amplifying unit 300 receives the delayed input signal DLY_IN and the pre-output signal OUT_PREB as differential inputs to output an output signal OUT.

Since the main amplifying unit 300 receives the input-delay signal DLY_IN as one of the differential inputs, it is less influenced by variation of the reference voltage VREF.

Figure 5:
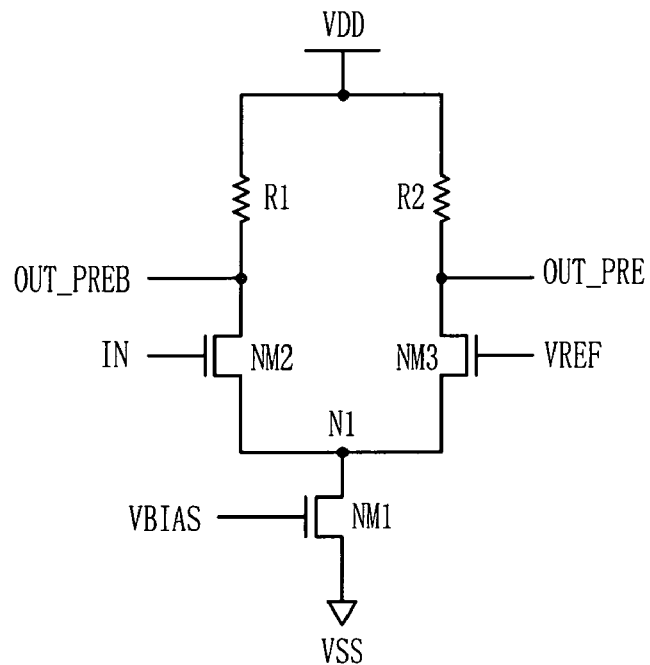
FIG. 5 is a circuit diagram of a pre-amplifying unit illustrated in FIG. 4.

FIG. 5 is a circuit diagram of the pre-amplifying unit 100 illustrated in FIG. 4. In FIG. 5, the pre-amplifying unit 100 is implemented with a differential amplifier.

As shown, the pre-amplifying unit 100 includes first to third NMOS transistors NM1, NM2 and NM3, a first resistor R1, and a second resistor R2. The first NMOS transistor NM1 has a gate receiving a bias voltage VBIAS, and a drain-source path connected between a node N1 and a ground terminal VSS. The second NMOS transistor NM2 has a gate receiving the input signal IN, and a drain-source path connected between a first output node and the node N1. The third NMOS transistor NM3 has a gate receiving the reference voltage VREF, and a drain-source path connected between a second output node and the node N1. The first resistor R1 is connected between the first output node and a power supply terminal VDD. The second resistor R2 is connected between the second output node and the power supply terminal VDD. The pre-amplifying unit 100 outputs a voltage of the first output node as the pre-output signal OUT_PREB.

Upon operation, the pre-output signal OUT_PREB of a logic high level is outputted when the input signal IN has a voltage level lower than that of the reference voltage VREF, and the pre-output signal OUT_PREB of a logic low level is outputted when the input signal IN has a voltage level higher than that of the reference voltage VREF.

Figure 6:
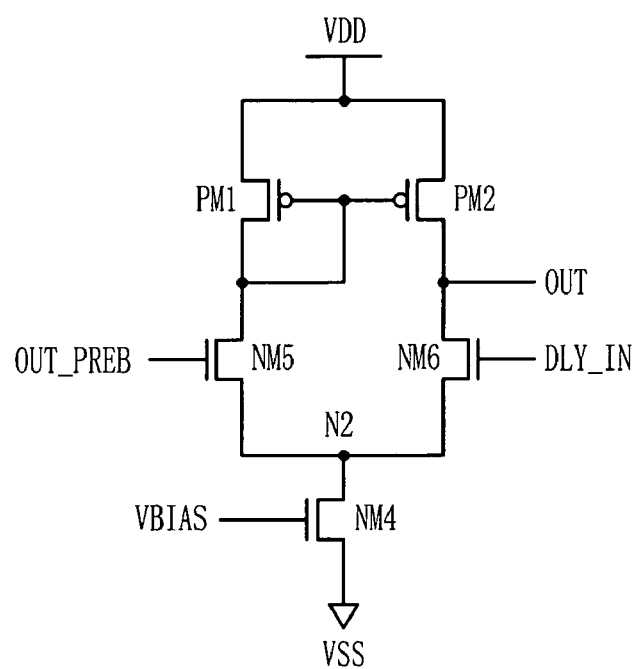
FIG. 6 is a circuit diagram of a main amplifying unit illustrated in FIG. 4.

FIG. 6 is a circuit diagram of the main amplifying unit 300 illustrated in FIG. 4.

Referring to FIG. 6, the main amplifying unit 300 includes fourth to sixth NMOS transistors NM4, NM5 and NM6 and first and second PMOS transistors PM1 and PM2. The fourth NMOS transistor NM4 has a gate receiving the bias voltage VBIAS, and a drain-source path connected between a node N2 and the ground voltage VSS. The fifth NMOS transistor NM5 has a gate receiving the pre-output signal OUT_PREB, and a drain-source path connected between a first output node and the node N2. The sixth NMOS transistor NM6 has a gate receiving the delayed input signal DLY_IN, and a drain-source path connected between a second output node and the node N2. The first PMOS transistor PM1 has a source-drain path connected between the first output node and the power supply terminal VDD. The second PMOS transistor PM2 has a source-drain path connected between the second output node and the power supply terminal VDD. The main amplifying unit 300 outputs a voltage of the second output node as the output signal OUT.

Upon operation, the output signal OUT of a logic high level is outputted when the delayed input signal DLY_IN has a voltage level lower than that of the pre-output signal OUT_PREB, and the output signal OUT of a logic low level is outputted when the delayed input signal DLY_IN has a voltage level higher than that of the pre-output signal OUT_PREB.

Figure 7:
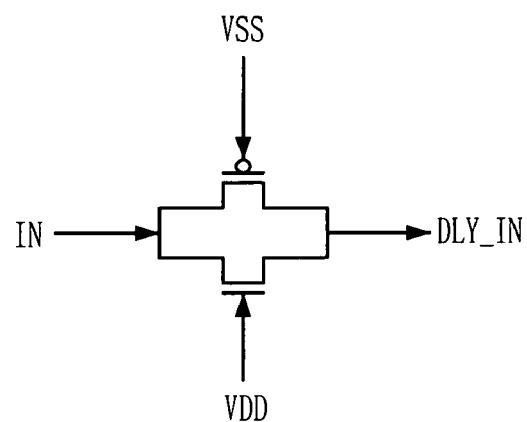
FIG. 7 is a circuit diagram of a delaying unit illustrated in FIG. 4.

FIG. 7 is a circuit diagram of the delaying unit 200 illustrated in FIG. 4.

Referring to FIG. 7, the delaying unit 200 includes a transfer gate implemented with a PMOS transistor and an NMOS transistor to transfer the input signal IN.

The delaying unit 200 has a delay time equal to a propagation delay of the pre-amplifying unit 100 and thus the delayed input signal DLY_IN has 180° phase difference with respect to the pre-output signal OUT_PREB.

In addition, the delaying unit 200 may be implemented using a resistor or a capacitor, instead of the transfer gate.

Figure 8:
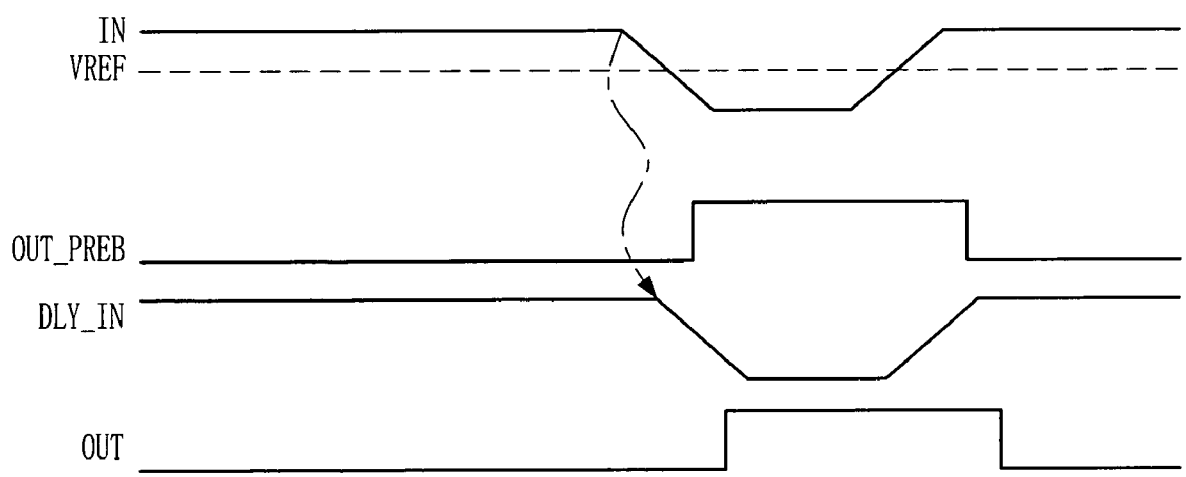
FIG. 8 illustrates operation waveforms of the semiconductor memory device illustrated in FIG. 4.

FIG. 8 is a waveform diagram of the signals used in the semiconductor memory device illustrated in FIG. 4.

Hereinafter, an operation of the semiconductor memory device will be described with reference to FIG. 8.

The pre-amplifying unit 100 outputs the pre-output signal OUT_PREB of a logic low level when the input signal IN has a voltage level higher than that of the reference voltage VREF. The delaying unit 200 delays the input signal IN by a predetermined delay time to output the delayed input signal DLY_IN.

The main amplifying unit 300 outputs the output signal OUT of a logic low level when the delayed input signal DLY_IN has a voltage level higher than that of the pre-output signal OUT_PREB.

When a pulse signal of a logic low level is applied as the input signal IN, the pre-amplifying unit 100 outputs a pulse signal of a logic high level as the pre-output signal OUT_PREB while the input signal IN has a voltage level lower than that of a reference voltage VREF. The delaying unit 200 delays the input signal IN by the predetermined delay time to output the delayed input signal DLY_IN.

The main amplifying unit 300 outputs a pulse signal of a logic high level as the output signal OUT when the delayed input signal DLY_IN has a voltage level lower than that of the pre-output signal OUT_PREB.

As described above, the output signal OUT generated through two-stage amplification process swings fully between 0V and the power supply voltage VDD.

Figure 9:
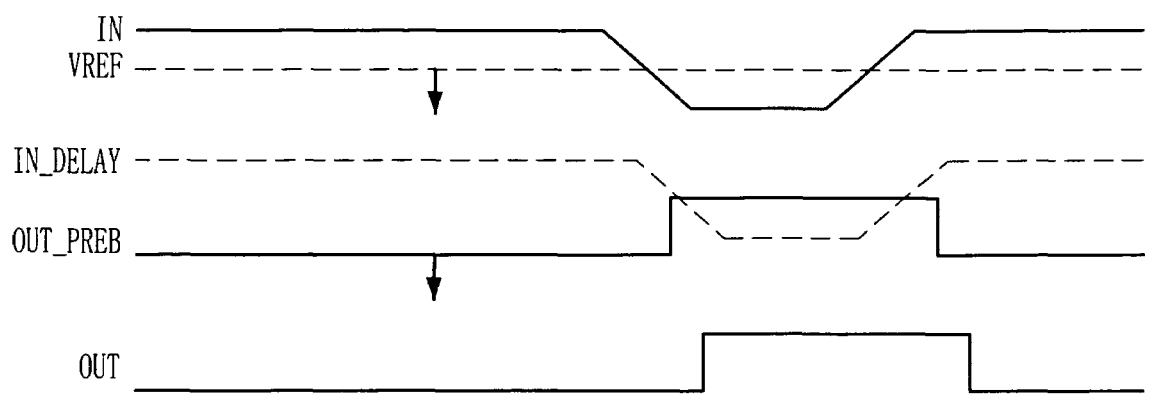
FIG. 9 is a waveform diagram of the signals used in the semiconductor memory device illustrated in FIG. 4 when a voltage level of the reference voltage VREF decreases.

FIG. 9 is a waveform diagram of the signals used in the semiconductor memory device illustrated in FIG. 4 when a voltage level of the reference voltage VREF decreases.

Referring to FIG. 9, the decrease of the reference voltage VREF influences the pre-output signal OUT_PREB of the pre-amplifying unit 100. However, the main amplifying unit 300 receives the delayed input signal DLY_IN and the pre-output signal OUT_PREB as the differential inputs. That is, the semiconductor memory device is not almost influenced by variation of the reference voltage VREF because it receives the delayed input signal DLY_IN, which is not influenced by the variation of the reference voltage VREF, as one of the differential inputs.

Since the conventional semiconductor memory device uses the positive and negative pre-output signals that are influenced by the variation of the reference voltage, the variation of the reference voltage is amplified. However, the semiconductor memory device in accordance with the embodiment of the present invention uses the delayed input signal as one of the differential inputs of the main amplifying unit and thus the influence of the reference voltage variation is reduced. That is, the semiconductor memory device generates the output signal insensitive to the variation of the reference voltage.

In accordance with the embodiments of the present invention, the setup/hold time margin can be ensured in the output signal of the semiconductor memory device. Therefore, the malfunction of the semiconductor memory device can be prevented and the reliability of the semiconductor memory device can be improved.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
a pre-amplifying unit configured to amplify a difference between an input signal and a reference signal to output a pre-output signal;
a delaying unit configured to delay the input signal to output a delayed input signal; and
a main amplifying unit configured to receive the pre-output signal and the delayed input signal as differential inputs to output an output signal.

2. The semiconductor memory device as recited in claim 1, wherein the delaying unit delays the input signal for a time corresponding to an operating time of the pre-amplifying unit.

3. The semiconductor memory device as recited in claim 1, wherein the delaying unit comprises a transfer gate configured to delay the input signal by an operation time of the pre-amplifying unit to output the delayed input signal having a 180° phase difference with respect to the pre-output signal.

4. The semiconductor memory device as recited in claim 1, wherein the delaying unit comprises a resistor configured to delay the input signal by a propagation delay of the pre-amplifying unit to output the delayed input signal.

5. The semiconductor memory device as recited in claim 1, wherein the delaying unit comprises a capacitor configured to delay the input signal by a propagation delay of the pre-amplifying unit to output the delayed input signal.

6. The semiconductor memory device as recited in claim 1, wherein the pre-amplifying unit comprises:
a first NMOS transistor having a gate receiving a bias voltage, and a drain-source path connected between a first node and a first power supply voltage terminal;
a second NMOS transistor having a gate receiving the input signal, and a drain-source path connected between a first output node and the first node;
a third NMOS transistor having a gate receiving the reference signal, and a drain-source path connected between a second output node and the first node;
a first resistor connected between the first output node and a second power supply voltage terminal; and
a second resistor connected between the second output node and the second power supply voltage terminal,
wherein a voltage of the first output node is outputted as the pre-output signal.

7. The semiconductor memory device as recited in claim 1, wherein the main amplifying unit comprises:
a first NMOS transistor having a gate receiving a bias voltage, and a drain-source path connected between a first node and a first power supply voltage terminal;
a second NMOS transistor having a gate receiving the pre-output signal, and a drain-source path connected between a first output node and the first node;
a third NMOS transistor having a gate receiving the delayed input signal, and a drain-source path connected between a second output node and the first node;
a first PMOS transistor having a source-drain path connected between the first output node and a second power supply voltage terminal; and
a second PMOS transistor having a source-drain path connected between the second output node and the second power supply voltage terminal,
wherein a voltage of the second output node is outputted as the output signal.

8. A method for driving a semiconductor memory device, comprising:
detecting and amplifying a difference between an input signal and a reference signal to output a pre-output signal;
delaying the input signal by a predetermined time to output a delayed input signal; and
amplifying a difference between the pre-output signal and the delayed input signal.

9. The method of claim 8, wherein the delayed input signal has a 180° phase difference with respect to the pre-output signal.

10. The method of claim 8, wherein the predetermined time includes a propagation delay required during detecting and amplifying the difference between the input signal and the reference signal.

* * * * *